(12) United States Patent
Liu et al.

(10) Patent No.: US 6,380,828 B1
(45) Date of Patent: Apr. 30, 2002

(54) SURFACE WAVE DEVICES WITH STATIC ELECTRIC FIELD

(75) Inventors: Wen Liu, Nepean; Steve A. Beaudin, Ottawa; Conrad F. Gratton, Casselman, all of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/624,029

(22) Filed: Jul. 24, 2000

(51) Int. Cl.[7] .................................................. H03H 9/42
(52) U.S. Cl. ..................... 333/193; 333/195; 310/313 R
(58) Field of Search ................................ 333/189, 193, 333/195; 310/313 R

(56) References Cited

U.S. PATENT DOCUMENTS

| | | | |
|---|---|---|---|
| 3,979,697 A | 9/1976 | Donahue | 331/107 |
| 4,055,816 A | 10/1977 | Woskow | 331/32 |
| 4,410,823 A * | 10/1983 | Miller et al. | 310/313 D |
| 4,635,008 A | 1/1987 | Solie | 333/195 |
| 4,728,912 A * | 3/1988 | Yuhara et al. | 333/193 |
| 4,746,882 A | 5/1988 | Solie | 333/196 |
| 4,908,542 A | 3/1990 | Solie | 310/313 R |
| 4,939,487 A * | 7/1990 | Yuhara et al. | 333/193 |
| 5,536,989 A * | 7/1996 | Skudera, Jr. | 310/313 R |
| 5,705,964 A * | 1/1998 | Tera et al. | 438/257 |
| 5,831,492 A | 11/1998 | Solie | 333/193 |

* cited by examiner

*Primary Examiner*—Robert Pascal
*Assistant Examiner*—Dean Takaoka

(57) ABSTRACT

A tapered IDT function is provided in an IDT of a SAW device having fingers substantially parallel to one another by applying a static electric field to a piezoelectric substrate of the SAW device to generate in the substrate a strain which varies across the aperture of the IDT, thereby varying a center frequency of the IDT across the aperture of the IDT. The electric field can be perpendicular to the fingers and created by applying a dc voltage between conductors at least one of which can be tapered or angled, either in the region of the IDT to produce a strain directly or adjacent to the IDT to produce a strain indirectly, or it can be parallel to the fingers, two fields with opposite directions being created at the two sides of the IDT.

15 Claims, 2 Drawing Sheets

SURFACE WAVE DEVICES WITH STATIC ELECTRIC FIELD

This invention relates to surface wave devices. The term "surface wave" is used herein to embrace surface acoustic waves (SAWs), including leaky SAWs, surface skimming bulk waves, and similar acoustic waves, and is abbreviated to SAW below.

BACKGROUND OF THE INVENTION

It is known to provide a SAW device with tapered interdigital transducers in order to provide a changing SAW wavelength, and hence a changing center frequency for SAW propagation, across the aperture of the SAW device, thereby to provide the SAW device with a relatively broad fractional bandwidth. The taper may be linear, hyperbolic, or in accordance with some other function, and tapers can be applied to IDTs of different types, for example to bidirectional IDTs and to SPUDTs (single phase unidirectional transducers) with and without known weighting techniques such as withdrawal weighting, finger position or width weighting, etc. SAW device filters using tapered IDTs can have advantages of low loss, a flat pass band, and good out-of-band rejection.

Tapered IDTs and SAW devices using them have also been referred to as having slanted finger geometries, but the term "slanted" is not used further herein to avoid potential confusion with other and different types of SAW device, such as slanted array compressors (SACs).

The gradually changing finger pitch across the aperture of a known tapered IDT requires a substantially increased resolution of the processes used for producing the IDT. For SAW devices intended for operation at high frequencies, such an increased resolution becomes increasingly difficult or impossible to provide.

For example, a SAW device for use as an RF (radio frequency) filter at a frequency of the order of 2 GHz may have a finger width of about 0.3 μm. To provide such an IDT with a tapered finger geometry with for example a fractional bandwidth of 1%, the finger width would vary from about 0.3 μm across the aperture of the IDT by ±0.0015 μm. The resolution limits of known SAW device processes can not practically meet the requirements for such a tapered finger geometry.

It would be desirable to be able to obtain the advantages of tapered IDTs in high frequency SAW devices, but this has not been possible in view of the resolution limits and requirements discussed above.

SUMMARY OF THE INVENTION

According to one aspect of this invention, a method of providing a tapered IDT function in an IDT of a SAW device having fingers substantially parallel to one another comprises applying a static electric field to a piezoelectric substrate of the SAW device to generate in said substrate a strain which varies across the aperture of the IDT.

Thus in a SAW device which operates in accordance with this method, the IDT fingers are parallel to one another, perpendicular to the direction of SAW propagation, as is conventional for a non-tapered IDT, so that an increased resolution is not required for producing the SAW device.

Instead, a static electric field is created, conveniently by applying a dc voltage to one or more additional conductors provided for this purpose on the surface of the piezoelectric substrate, in such a manner that, due to the piezoelectric effect of the substrate, there is a strain in the region of the IDT, this strain varying across the aperture of the IDT so that the SAW propagation velocity is different at different points across the aperture of the IDT.

Thus instead of geometrically changing the finger pitch, and hence center frequency SAW wavelength, across the aperture of an IDT as is the case for a known tapered IDT, the finger pitch is maintained geometrically constant and the SAW propagation velocity is changed across the aperture as a result of the strain due to the electric field. As the SAW device frequency is equal to the SAW propagation velocity divided by the SAW wavelength, a similar result can be obtained in that the SAW device center frequency is varied across the aperture of the IDT.

The substrate in the region of the IDT can be directly subjected to the electric field, directly creating a strain in this area, with the variation in the electric field being conveniently provided by a dc voltage applied to a tapered or angled conductor. Unlike the tapered finger geometry of a tapered IDT, the taper or angle of such a conductor does not require an increased resolution. Different electric field strengths could alternatively be created in different regions across the aperture of the IDT by applying different voltages to respective conductors.

Alternatively, the electric field can be created in an area of the substrate surface adjacent to the IDT, thereby directly producing a strain in this area, this strain indirectly resulting in a strain in the region of the IDT and varying across its aperture. The small size of high frequency SAW devices facilitates this result of an indirectly produced strain. This has the advantage that conductors for applying a dc voltage to create the electric field are separated from the conductors of the IDT. As described further below, the indirect strain can be produced with an electric field created either at one end of the IDT or laterally at one or both of the sides of the IDT.

It will be appreciated that-these techniques can be combined, among themselves and/or with other techniques (e.g. a tapered finger geometry) known in the art, to produce further results. In addition, it will be appreciated that a dc voltage used for creating the static electric field may be varied to provide tuning of the frequency characteristics of the SAW device.

Another aspect of the invention provides a method of varying a center frequency-of an IDT (interdigital transducer) of a SAW (surface wave) device across an aperture of the IDT, comprising applying a static electric field to a piezoelectric substrate of the SAW device to generate in said substrate a strain which varies across the aperture of the IDT.

In this method, the electric field can be applied to the substrate in the region of the IDT and in a direction substantially perpendicular to fingers of the IDT by applying a voltage between conductors on the substrate to produce an electric field strength varying across the aperture of the IDT; the conductors can comprise at least one angled or tapered conductor.

Alternatively, the electric field can be applied to the substrate in an area adjacent to the IDT to produce indirectly a strain varying across the aperture of the IDT. For example, the electric field can be created by applying a voltage between conductors adjacent to an end of the IDT, the electric field having a direction substantially perpendicular to fingers of the IDT and varying across the aperture of the IDT, or by applying a voltage between conductors adjacent to a side of the IDT, the electric field having a direction substantially-parallel to fingers of the IDT. Further, two electric fields-can be created by applying a voltage between conductors on the substrate adjacent to each side of the IDT, the two electric fields having directions opposite to one another and substantially parallel to fingers of the IDT to produce indirectly a strain varying across the aperture of the IDT.

The invention also provides a SAW (surface wave) device comprising: a piezoelectric substrate; at least one IDT (interdigital transducer) on a surface of the substrate, the IDT having interdigital fingers substantially parallel to one another for propagation of a SAW in a direction substantially perpendicular to the fingers within an aperture of the IDT; and at least one conductor on the surface of the substrate for receiving a dc voltage to create a static electric field to produce in said substrate a strain which varies across the aperture of the IDT thereby to vary a center frequency of the IDT across the aperture.

Said at least one conductor can comprise conductors adjacent to ends of the IDT for establishing said electric field in the region of the IDT with an electric field strength which varies across the aperture of the IDT, or conductors in an area adjacent to and end of the IDT for establishing said electric field in said area with a direction substantially perpendicular to the fingers and varying across the aperture of the IDT, whereby a strain varying across the aperture of the IDT is produced indirectly in a region of the IDT.

Alternatively, said at least one conductor can comprise conductors adjacent to each side of the IDT for establishing two electric fields having directions opposite to one another and substantially parallel to fingers of the IDT, whereby a strain varying across the aperture of the IDT is produced indirectly in a region of the IDT.

BRIEF DESCRIPTION OF THE DRAWINGS

The invention will be further understood from the following description with reference to the accompanying drawings, which are illustrative only and in which.

DETAILED DESCRIPTION

Figure 1:
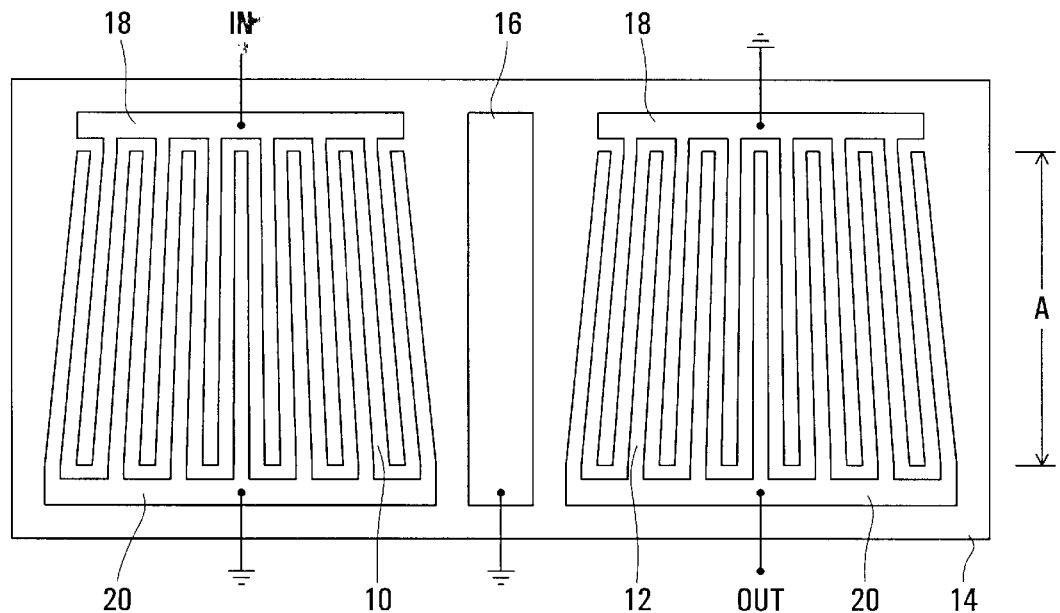
FIG. 1 schematically illustrates a SAW device with tapered IDTs as is known in the art.

Referring to the drawings, FIG. 1 represents a known SAW device having tapered interdigital transducers (IDTs) 10 and 12 on a piezoelectric substrate 14. The IDTs 10 and 12 are coupled in line with one another for propagation of surface acoustic waves (SAWs) therebetween via an isolating electrode 16, which for example is a relatively wide grounded conductive layer formed at the same time as conductors of the IDTs. The electrode 16 is optional and may be omitted. Each of the IDTs 10 and 12 comprises interdigital fingers extending from conductive rails 18, 20 at opposite sides of the IDT, one of which rails is grounded and the other of which provides an input connection IN or an output connection OUT, the connections being interchangeable as is known. Differential signal connections can alternatively be provided in known manner. Between the rails 18 and 20, over an aperture A of the IDTs, the periodicity of the fingers (the widths of the fingers and of the gaps between the fingers) changes, linearly as shown, to provide different SAW center frequencies at different points across the aperture, thereby providing a relatively broad pass band of the SAW device as a whole. The IDTs 10 and 12 are arranged symmetrically relative to the electrode 16, and have a center-to-center distance between the IDTs which is the same for all frequencies across the aperture A so that the SAWs at different frequencies or wavelengths all have the same delay through the SAW device from its input to its output.

Although as shown in FIG. 1 the taper is linear, it may alternatively be hyperbolic or in accordance with some other characteristic. Although the IDTs 10 and 12 are shown as being bidirectional IDTs with only a few fingers and without weighting, they may alternatively be of any other type with or without weighting, and typically may comprise large numbers of fingers. Although the IDTs 10 and 12 are represented as being the same on each side of the electrode 16, they can be different, for example the input and output IDTs may have different numbers of fingers. It should be understood that the same, similar, or equivalent variations can be provided, individually and in various combinations, in SAW devices in accordance with embodiments of the invention as described below.

As discussed above, masking for and production of the fingers of the tapered IDTs 10 and 12 of the SAW device of FIG. 1 requires a higher resolution than would be required for a SAW device having parallel IDT fingers for operation at the same frequency. This becomes impractical or impossible to achieve for SAW devices intended for high frequency operation, for example for a SAW device to be used as an RF filter at frequencies of about 2 GHz or more. It can be appreciated that such a SAW device is already very small, for example occupying a piezoelectric substrate area of only about 1 mm$^2$, with a finger width of about 0.3 $\mu$m. Thus very high resolution processes would be required to provide such an IDT with a tapered finger geometry as illustrated in FIG. 1.

Figure 2:
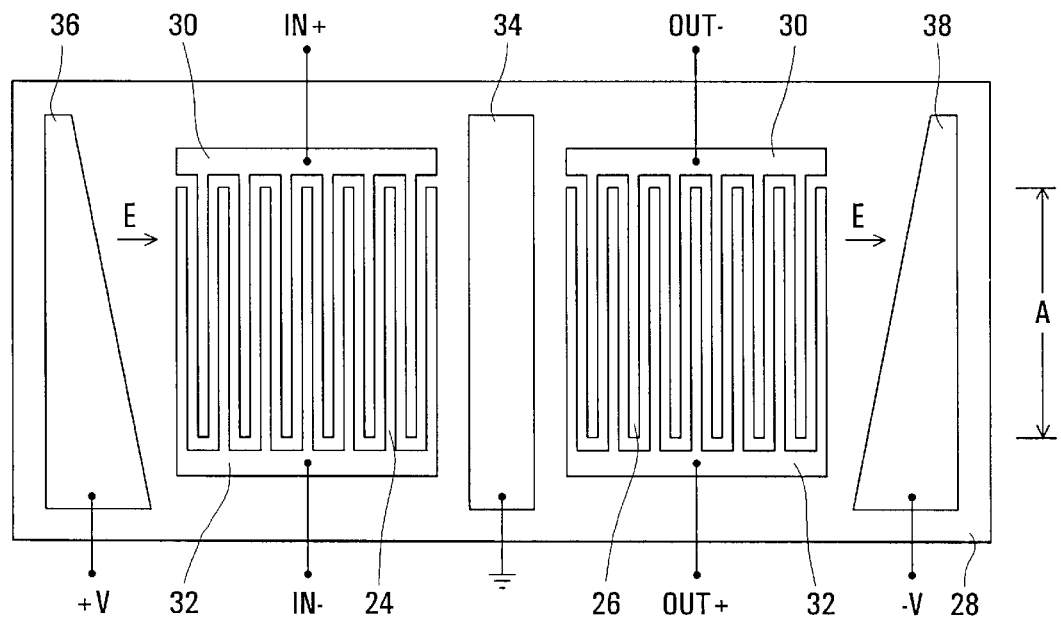
FIG. 2 schematically illustrates a SAW device in accordance with a first embodiment of the invention.

FIG. 2 illustrates a SAW device in accordance with a first embodiment of the invention comprising IDTs 24 and 26 on a surface of a piezoelectric substrate 28. Each of the IDTs 24 and 26 comprises parallel, constant-width interdigital fingers extending from conductive rails 30 and 32 at opposite sides of the IDT. The rails 30 and 32 of the IDT 24 are supplied with differential input signals IN+ and IN- respectively, and differential output signals OUT- and OUT+ are derived from the rails 30 and 32 of the IDT 26. The IDTs 24 and 26 are thus conventional, non-tapered IDTs, with constant finger width and spacing across the aperture A of the IDTs. The IDTs 24 and 26 are coupled in line with one another for propagation of surface acoustic waves (SAWs) therebetween via a grounded isolating electrode 34. The electrode 34 is shown as a relatively wide conductive layer, but it could alternatively comprise grounded fingers or could have any other form known in the art for isolating or grounded electrodes.

The SAW device of FIG. 2 also includes two tapered conductors 36 and 38, for connection of dc voltages +V and -V respectively, adjacent the ends of the IDTs 24 and 26 respectively. The taper of each of these conductors 36 and 38 is such that a distance between the conductor 36 or 38 and the grounded electrode 34 varies across the aperture A of the IDTs, so that a static electric field E established in operation between the conductors 36 and 38 and the grounded electrode 34 also varies in field strength across the aperture A of the IDTs. As illustrated in FIG. 2, the tapers of the conductors 36 and 38 are linear, so that the electric field E also-changes linearly across the aperture A, but the conductors 36 and 38 can alternatively be tapered or shaped non-linearly to provide a non-linear change of the electric field E across the aperture A. Also as shown in FIG. 2, the conductors 36 and 38 and the grounded electrode 34 extend laterally (i.e. perpendicularly to the direction of SAW propagation between the IDTs) beyond the aperture A of the IDTs, to maintain the linear change in the electric field E over the entire aperture A of the IDTs despite possible edge effects in areas of the substrate 28 between the ends of the conductors 36 and 38 and the grounded electrode 34.

It can be appreciated that the electric field E provides a stress which produces a consequent strain in the piezoelectric substrate 28 between the conductors 36 and 38 and the grounded electrode 34, and that this strain varies with the varying field strength of the electric field E across the aperture A of the IDTs. This stress and strain result in a change in velocity of SAWs propagated between the IDTs 24 and 26, and hence a change in center frequency of the SAW device across the aperture A. The nature and characteristics of this change in SAW velocity across the aperture A depends on parameters such as the piezoelectric substrate material and orientation (crystal cut and SAW propagation direction), the magnitude and direction of the electric field E, and the extent and characteristics of the taper of the conductors 36 and 38. Such parameters can be selected and varied to provide a desired change in SAW center frequency across the aperture A, similar to that provided by a geometrically tapered SAW device as shown in FIG. 1 but without its requirements for increased resolution.

Figure 3:
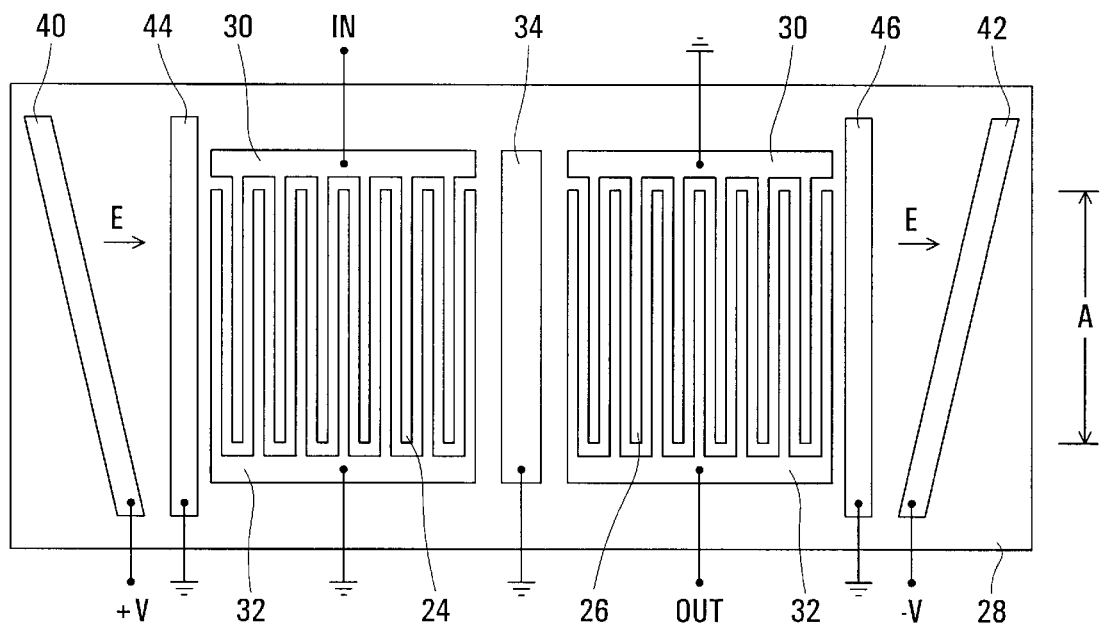
FIG. 3 schematically illustrates a SAW device in accordance with a second embodiment of the invention.

The differential signal input and output connections of the SAW device of FIG. 2 are provided because a single-ended input or output connection would have one side grounded, thereby changing the electric field E. FIG. 3 illustrates a SAW device in accordance with a second embodiment of this invention in which this is avoided by creating the electric field E outside of but adjacent to the region of the IDTs, and relying on an indirect effect to produce a desired change in the SAW velocity in the region of the IDTs.

Referring to FIG. 3, in which the same references as in FIG. 2 are used to denote corresponding parts, a static electric field E is created adjacent and longitudinally outwardly of the IDT 24 between an angled or inclined conductor 40 and an additional conductor 44 parallel to the IDT fingers, and similarly a static electric field E is created adjacent and longitudinally outwardly of the IDT 26 between an angled or inclined conductor 42 and an additional conductor 46 parallel to the IDT fingers. In operation of the SAW device of FIG. 3, the conductors 44 and 46 are grounded, and the dc voltages +V and −V are supplied to the conductors 40 and 42 respectively. The isolating electrode 34 can be grounded as shown in FIG. 3, or it can be electrically floating or omitted. Because the electric fields E are established in areas outwardly of the IDTs 24 and 26, these IDTs can have single-ended connections as shown in FIG. 3, or either or both of them can have differential connections as in the SAW device of FIG. 2.

In the SAW device of FIG. 3, the electric fields E change progressively across the aperture A of the IDTS, but are not present in the regions of the IDTs themselves. These electric fields provide stresses and directly produce consequent strains in the areas of the fields, in the same manner as described above in relation to the SAW device of FIG. 2. Especially in view of the small size of the substrate 28 for a SAW device for operation at high frequency, for example about 1 mm square for center frequencies of the order of 2 GHz, the strains directly produced in part of the substrate result in complementary strains in adjacent parts of the substrate. Thus compression or expansion of the piezoelectric substrate 28 in the areas of the electric fields E result indirectly in expansion or compression, respectively, in the regions of the IDTs 24 and 26. The indirectly produced strain varies across the aperture A of the IDTs in accordance with the directly produced strain in the areas of the electric fields E, so that again there is a change in SAW propagation velocity, and hence in center frequency of the SAW device, across the aperture A.

In the SAW devices of FIGS. 2 and 3 the electric fields E are created in the longitudinal direction of the SAW device with changing field strengths across the aperture A of the SAW device to produce a variation in SAW velocity across the aperture of the device. Such a variation can also be produced by an electrical field having a different direction, depending upon the orientation and characteristics of the piezoelectric substrate. By way of example, FIG. 4 illustrates third embodiment of the invention in which electric fields E are created perpendicular to the SAW propagation direction.

Figure 4:
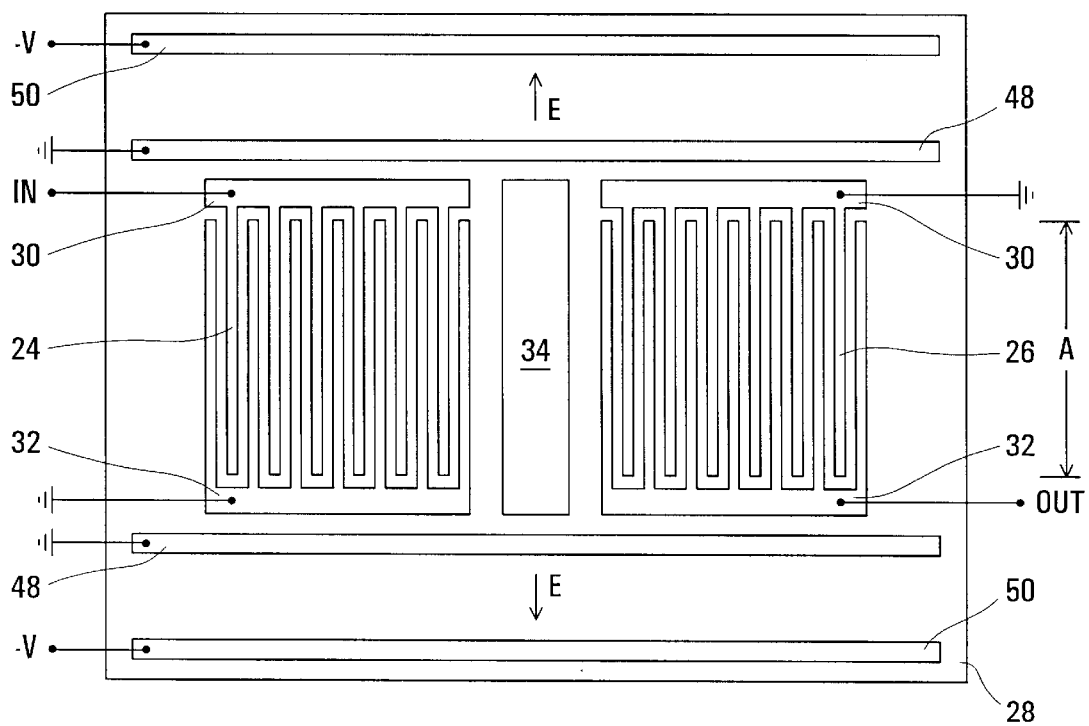
FIG. 4 schematically illustrates a SAW device in accordance with a third embodiment of the invention.

Referring to FIG. 4, the IDTs 24 and 26 are arranged on the piezoelectric substrate 28, and are shown with single-ended connections (either or both of them could instead be differential connections), in the same manner as in FIG. 3. In the SAW device of FIG. 4 for convenience the isolating conductive layer 34 is shown electrically floating; it could instead be grounded or omitted. Laterally on each side of the IDTs 24 and 26, parallel to the rails 30 and 32, are two additional spaced conductors 48 and 50 which extend over the entire length of the SAW device. In operation of the SAW device of FIG. 4, the conductors 48 are grounded and a dc voltage −V is supplied to the conductors 50 (or vice versa) to establish static electric fields E between these conductors. Because the conductors 48 and 50 are parallel, the electric fields E in this case are uniform. Unlike the electric fields E in the SAW devices of FIGS. 2 and 3 which have the same direction in each case, the electric fields E in the SAW device of FIG. 4 are oppositely directed, as represented in FIG. 4 by oppositely-directed arrows both pointing outwardly from the IDTs.

Thus in operation of the SAW device of FIG. 4, the opposite electric fields E at the two sides of the IDTs 24 and 26 provide opposite stresses which can produce opposite strains, for example an expansion at one side and a compression at the other side of the IDTs. In a similar manner to that described above in relation to the SAW device of FIG. 3, and again especially in the case of a high frequency SAW device, these strains due to the electric fields E in areas adjacent to but outwardly of the IDTs 24 and 26 can produce complementary strains in the regions of the IDTs 24 and 26, which again vary across the aperture A of the IDTs. The indirectly produced strains in the regions of the IDTs 24 and 26 again change the SAW propagation velocity, and hence the center frequency, so that this also varies across the aperture A.

It is observed that in the SAW device of FIG. 4 the electric fields E are parallel to the fingers of the IDTs 24 and 26, but produce a shear stress and consequent shear strain in a direction perpendicular to the electric fields E and hence perpendicular to the IDT fingers. In this respect it can be appreciated that in a piezoelectric material the stresses and strains due to an electric field are related by matrix equations, so that stresses and strains can be produced with directions different from that of an electric field producing them. This characteristic of piezoelectric materials is made use of by the SAW device of FIG. 4, and it can be appreciated that other directions of electric field, and consequent stresses and strains can also be utilized in a similar manner.

Although particular embodiments of the invention are described above and illustrated in FIGS. 2 to 4, it can be appreciated that these are provided to illustrate principles which are used by embodiments of the invention, and numerous modifications, variations, and adaptations may be made within the scope of the invention as defined in the claims.

In particular, it can be appreciated that the strain produced and the effect on SAW velocity, and hence the effect on IDT and filter characteristics, of any particular electric field applied as described above will depend upon various factors including the piezoelectric substrate material and orientation, the electric field strength and relative direction, and the relative direction of SAW propagation. Thus any or all of these, as well as the taper of the conductors 36 and 38 in the SAW device of FIG. 2 or the angle and shape of the conductors 40 and 42 in the SAW device of FIG. 3, may be varied to provide particular characteristics of the IDTs and SAW devices. In addition, different electric fields, such as those provided in the SAW devices of FIGS. 3 and 4 as described above, can be used in combination in the same SAW device to provide further variations. Additionally, it can be appreciated that the provision of electric fields as described herein can be applied to other types of IDT and other types of SAW device from those specifically referred to here, and can also be used in combination with other known techniques for varying characteristics of the SAW devices.

What is claimed is:

1. A method of varying a center frequency of an IDT (interdigital transducer) of a SAW (surface wave) device across an aperture of the IDT, comprising applying a static electric field to a piezoelectric substrate of the SAW device to generate in said substrate a strain which varies across the aperture of the IDT.

2. A method as claimed in claim 1 wherein the IDT has fingers substantially parallel to one another.

3. A method as claimed in claim 1 wherein two electric fields are created by applying a voltage between conductors on the substrate adjacent to each side of the IDT, the two electric fields having directions opposite to one another and substantially parallel to fingers of the IDT to produce indirectly a strain varying across the aperture of the IDT.

4. A method as claimed in claim 1 wherein the electric field is applied to the substrate in the region of the IDT and in a direction substantially perpendicular to fingers of the IDT by applying a voltage between conductors on the substrate to produce an electric field strength varying across the aperture of the IDT.

5. A method as claimed in claim 4 wherein said conductors comprise at least one angled or tapered conductor.

6. A method as claimed in claim 1 wherein the electric field is applied to the substrate in an area adjacent to the IDT to produce indirectly a strain varying across the aperture of the IDT.

7. A method as claimed in claim 6 wherein the electric field is created by applying a voltage between conductors adjacent to a side of the IDT, the electric field having a direction substantially parallel to fingers of the IDT.

8. A method as claimed in claim 6 wherein the electric field is created by applying a voltage between conductors adjacent to an end of the IDT, the electric field having a direction substantially perpendicular to fingers of the IDT and varying across the aperture of the IDT.

9. A method as claimed in claim 8 wherein said voltage comprises a dc voltage and said conductors comprise at least one angled or tapered conductor.

10. A method of providing a tapered IDT (interdigital transducer) function in an IDT of a SAW (surface wave) device having fingers substantially parallel to one another, comprising applying a static electric field to a piezoelectric substrate of the SAW device to generate in said substrate a strain which varies across the aperture of the IDT.

11. A method as claimed in claim 10 wherein the electric field is applied to the substrate in the region of the IDT and in a direction perpendicular to fingers of the IDT by applying a voltage between conductors on the substrate to produce an electric field strength varying across the aperture of the IDT.

12. A method as claimed in claim 10 wherein the electric field is applied to the substrate in an area adjacent to the IDT to produce indirectly a strain varying across the aperture of the IDT.

13. A method as claimed in claim 12 wherein the electric field is created by applying a voltage between conductors adjacent to an end of the IDT, the electric field having a direction perpendicular to fingers of the IDT and varying across the aperture of the IDT.

14. A method as claimed in claim 12 wherein two electric fields are created by applying a voltage between conductors on the substrate adjacent to each side of the IDT, the two electric fields having directions opposite to one another and parallel to fingers of the IDT to produce indirectly a strain varying across the aperture of the IDT.

15. A SAW device comprising:

a piezoelectric substrate;

at least one IDT (interdigital transducer) on a surface of the substrate, the IDT having interdigital fingers substantially parallel to one another for propagation of a SAW in a direction substantially perpendicular to the fingers within an aperture of the IDT; and at least one conductor on the surface of the substrate for receiving a dc voltage to create a static electric field to produce in said substrate a strain which varies across the aperture of the IDT thereby to vary a center frequency of the IDT across the aperture;

wherein said at least one conductor comprises conductors adjacent to each side of the IDT for establishing two electric fields having directions opposite to one another and substantially parallel to fingers of the IDT, whereby a strain varying across the aperture of the IDT is produced indirectly in a region of the IDT.

\* \* \* \* \*